US012772523B2

(12) United States Patent
Hebert

(10) Patent No.: US 12,772,523 B2
(45) Date of Patent: Oct. 20, 2026

(54) FIELD-EFFECT TRANSISTORS FORMED USING A WIDE BANDGAP SEMICONDUCTOR MATERIAL

(71) Applicant: GlobalFoundries U.S. Inc., Malta, NY (US)

(72) Inventor: Francois Hebert, San Mateo, CA (US)

(73) Assignee: GlobalFoundries U.S. Inc., Malta, NY (US)

( * ) Notice: Subject to any disclaimer, the term of this patent is extended or adjusted under 35 U.S.C. 154(b) by 517 days.

(21) Appl. No.: 18/098,999

(22) Filed: Jan. 19, 2023

(65) Prior Publication Data

US 2024/0250126 A1 Jul. 25, 2024

(51) Int. Cl.
*H10D 62/832* (2025.01)
*H10D 30/01* (2025.01)
(Continued)

(52) U.S. Cl.
CPC ....... *H10D 62/8325* (2025.01); *H10D 30/025* (2025.01); *H10D 30/63* (2025.01);
(Continued)

(58) Field of Classification Search
CPC ............. H10D 62/107; H10D 62/8325; H10D 62/8303; H10D 62/351; H10D 62/357; H10D 62/393; H10D 64/015; H10D 64/018; H10D 64/027; H10D 64/035; H10D 64/20; H10D 64/23; H10D 64/251; H10D 64/2523; H10D 64/2565; H10D 64/258; H10D 64/311; H10D 64/411; H10D 30/0293; H10D 30/0297; H10D 30/668;
(Continued)

(56) References Cited

U.S. PATENT DOCUMENTS 5,567,634 A 10/1996 Hebert et al.
5,641,695 A * 6/1997 Moore ................. H10D 12/031 438/945

(Continued)

FOREIGN PATENT DOCUMENTS

CN 217468442 U 9/2022
WO 2018212282 A1 11/2018
WO 2019101009 A1 5/2019

OTHER PUBLICATIONS

U.S. Patent and Trademark Office; Non-Final Office Action issued in U.S. Appl. No. 18/103,776, filed Jun. 13, 2025; 36 pages.

(Continued)

*Primary Examiner* — Natalia A Gondarenko
(74) *Attorney, Agent, or Firm* — Thompson Hine LLP; Francois Pagette

(57) ABSTRACT

Structures for a field-effect transistor and methods of forming such structures. The structure comprises a semiconductor substrate including a top surface, a doped region adjacent to the top surface, and a trench that extends through the doped region. The semiconductor substrate comprises a wide bandgap semiconductor material. The structure further comprises a gate structure including a gate conductor layer. The gate conductor layer has a first portion disposed above the top surface of the semiconductor substrate and a second portion disposed inside the trench below the top surface of the semiconductor substrate.

17 Claims, 6 Drawing Sheets

(51) Int. Cl.

| | |
|---|---|
| ***H10D 30/63*** | (2025.01) |
| ***H10D 64/27*** | (2025.01) |
| ***H10P 14/40*** | (2026.01) |
| ***H10P 14/60*** | (2026.01) |
| ***H10P 76/40*** | (2026.01) |

(52) U.S. Cl.
CPC ......... *H10D 64/513* (2025.01); *H10D 64/519* (2025.01); *H10P 14/414* (2026.01); *H10P 14/6314* (2026.01); *H10P 76/405* (2026.01)

(58) Field of Classification Search
CPC .. H10D 30/025; H10D 30/0289; H10D 30/63; H10D 30/658; H10D 48/031; H10D 62/052; H10D 62/10; H10D 62/104; H10D 62/105; H10D 62/117; H10D 62/124; H10D 62/149; H10D 62/155; H10D 62/156; H10D 62/213; H10D 62/221; H10D 62/235; H10D 62/292; H10D 64/511; H10D 64/512; H10D 64/513; H10D 64/514; H10D 64/517; H10D 64/519; H10D 64/605; H10D 64/62; H10D 64/66; H10D 64/661; H10D 64/675; H10D 30/0291; H10D 30/0312; H10D 30/0616; H10D 30/608; H10D 30/66; H10D 30/6727; H10D 30/693; H10D 30/694; H10D 30/699; H10D 30/794; H01L 21/02244; H01L 21/0332; H01L 21/28518; H01L 21/32053; H10P 14/40; H10P 14/412; H10P 14/414; H10P 14/6314; H10P 14/6322; H10P 76/40; H10P 76/403; H10P 76/405; H10P 76/408
USPC ........... 257/77, 330, 332, 333; 438/270, 589
See application file for complete search history.

(56) References Cited

U.S. PATENT DOCUMENTS

| | | | | |
|---|---|---|---|---|
| 6,180,958 | B1 | 1/2001 | Cooper, Jr. | |
| 7,498,633 | B2 | 3/2009 | Cooper et al. | |
| 7,659,571 | B2 * | 2/2010 | Yamazaki | H10D 30/608 257/330 |
| 11,563,080 | B2 | 1/2023 | Lichtenwalner | |
| 2004/0124461 | A1 | 7/2004 | Gajda | |
| 2006/0197148 | A1 * | 9/2006 | Hsu | H10D 30/668 257/E21.199 |
| 2010/0224932 | A1 | 9/2010 | Takaya et al. | |
| 2011/0136310 | A1 | 6/2011 | Grivna | |
| 2011/0241644 | A1 | 10/2011 | Hashimoto | |
| 2013/0065384 | A1 | 3/2013 | Hiyoshi et al. | |
| 2013/0200451 | A1 | 8/2013 | Yilmaz | |
| 2014/0170823 | A1 | 6/2014 | Lin | |
| 2014/0196863 | A1 | 7/2014 | Bates | |
| 2016/0099316 | A1 * | 4/2016 | Arai | H01L 21/047 257/77 |
| 2016/0260608 | A1 * | 9/2016 | Ikeda | H01L 21/324 |
| 2016/0293441 | A1 * | 10/2016 | Lee | H10B 43/50 |
| 2018/0197947 | A1 | 7/2018 | Iwaya et al. | |
| 2020/0020762 | A1 * | 1/2020 | Frank | H10D 1/68 |
| 2021/0119039 | A1 | 4/2021 | Miida | |
| 2021/0343834 | A1 | 11/2021 | Lichtenwalner | |
| 2023/0122090 | A1 | 4/2023 | Fiorenza | |
| 2023/0253458 | A1 * | 8/2023 | Matsunaga | H10D 30/0297 257/77 |
| 2023/0420527 | A1 | 12/2023 | Sampath et al. | |
| 2024/0063309 | A1 | 2/2024 | Hebert et al. | |
| 2025/0261414 | A1 | 8/2025 | Yuan | |

OTHER PUBLICATIONS

Xinxin Zuo et al., “A 1200 V SiC Trench MOSFET with a Laterally Widened P-Shield Region to Enhance the Short-Circuit Ruggedness.” Electronics 2022, vol. 11, Issue 7, 1077, pp. 1-12; https://doi.org/10.3390/electronics11071077.

Fukui, Yutaka, et al., “Effects of Grounding Bottom Oxide Protection Layer in Trench-Gate SiC-MOSFET by Tilted AI Implantation.” Materials Science Forum, vol. 1004, Trans Tech Publications, Ltd., Jul. 2020, pp. 764-769. Crossref, doi:10.4028/www.scientific.net/msf.1004.764.

J. Wei et al., “Charge storage effect in SiC trench MOSFET with a floating P-shield and its impact on dynamic performances,” 2017 29th International Symposium on Power Semiconductor Devices and IC’s (ISPSD), Sapporo, Japan, 2017, pp. 387-390, doi: 10.23919/ISPSD.2017.7988985.

J. Wei et al., “Dynamic Degradation in SiC Trench MOSFET With a Floating p-Shield Revealed With Numerical Simulations,” in IEEE Transactions on Electron Devices, vol. 64, No. 6, pp. 2592-2598, Jun. 2017, doi: 10.1109/TED.2017.2697763.

Xuan Li et al., “SiC Trench MOSFET With Integrated Self-Assembled Three-Level Protection Schottky Barrier Diode.” IEEE Transactions on Electron Devices, (2018) vol. 65, pp. 347-351; DOI:10.1109/TED.2017.2767904.

Dai, Tian, et al., “Design Optimization of 1.2kV 4H-SiC Trench MOSFET.” Materials Science Forum, vol. 963, Trans Tech Publications, Ltd., Jul. 2019, pp. 605-608. Crossref, doi:10.4028/www.scientific.net/msf.963.605.

Tanaka, Rina, et al., “Performance Improvement of Trench-Gate SiC MOSFETs by Localized High-Concentration N-Type Ion Implantation.” Materials Science Forum, vol. 1004, Trans Tech Publications, Ltd., Jul. 2020, pp. 770-775. Crossref, doi:10.4028/www.scientific.net/msf.1004.770.

Sampath, Madankumar, et al., “A fully self-aligned SiC trench MOSFET with 0.5 µm channel pitch.” The International Conference on Silicon Carbide and Related Materials (ICSCRM), Davos, Switzerland, Sep. 11-16, 2022; pp. 1-8.

Sampath, Madankumar, et al., “Comparison of Single- and Double-Trench UMOSFETs in 4H-SiC.” Materials Science Forum, vol. 924, Trans Tech Publications, Ltd., Jun. 2018, pp. 752-755. Crossref, doi:10.4028/www.scientific.net/msf.924.752.

Sampath, Madankumar, et al. “The IMOSFET: A Deeply-Scaled Fully-Self-Aligned Trench MOSFET.” Materials Science Forum, vol. 1004, Trans Tech Publications, Ltd., Jul. 2020, pp. 751-757. Crossref, doi:10.4028/www.scientific.net/msf.1004.751.

J. R. Mileham et al., “Wet chemical etching of AIN.” Applied Physics Letters, vol. 67, Issue 8, https://doi.org/10.1063/1.114980, pp. 1119-1121 (Aug. 21, 1995).

Saravanan, Solangkili & Berenschot, J.W. & Krijnen, Gijs & Elwenspoek, M.. (2004). “Surface Micromachining Process for the Integration of AIN Piezoelectric Microstructures.” Journal of Materials Processing Technology.

Sandia National Laboratories. “Ultra-High-Temperature Ceramics to Withstand 2000 Degrees Celsius.” ScienceDaily. ScienceDaily, Oct. 21, 2003. <www.sciencedaily.com/releases/2003/10/031020055530.htm>.

Hebert, Francois, “Field-Effect Transistors With a High-Temperature Hardmask and Self-Aligned P-Shield” filed on Jan. 31, 2023 as a U.S. Appl. No. 18/103,776.

Hebert, Francois, “Field-Effect Transistors With Self-Aligned P-Shield Contacts” filed on Feb. 13, 2023 as a U.S. Appl. No. 18/109,126.

D. G. Senesky and A. P. Pisano, “Aluminum nitride as a masking material for the plasma etching of silicon carbide structures,” 2010 IEEE 23rd International Conference on Micro Electro Mechanical Systems (MEMS), Hong Kong, China, 2010, pp. 352-355, doi: 10.1109/MEMSYS.2010.5442492.

T. Dai, Z. Mohammadi, S. A. O. Russell, C. A. Fisher, M. R. Jennings and P. A. Mawby, “4H-SiC trench structure fabrication with Al2O3 etching mask,” 2016 European Conference on Silicon

(56) References Cited

OTHER PUBLICATIONS

Carbide & Related Materials (ECSCRM), Halkidiki, Greece, 2016, pp. 1-1, doi: 10.4028/www.scientific.net/MSF.897.371.
Fu, Xiao-An & Dunning, Jeremy & Zorman, Christian & Mehregany, Mehran. (2005). "Polycrystalline 3C-SiC thin films deposited by dual precursor LPCVD for MEMS applications." Sensors and Actuators A: Physical. 119. 169-176. 10.1016/j.sna.2004.09.009.
Guy Chichignoud, Laurent Auvray, Elisabeth Blanquet, Mikhail Anikin, Etienne Pernot, et al.. "Processing of Poly-SiC Substrates with Large Grains for Wafer-Bonding." Materials Science Forum, 2006, 527-529, pp. 71-74.
Thomas M. Sullivan, "Large polycrystalline wafers boost SiC's prospects." III-Vs Review, vol. 12, Issue 5, 1999, pp. 34-37, ISSN 0961-1290, https://doi.org/10.1016/S0961-1290(00)80024-1.
European Patent Office, Extended European Search Report and Opinion issued in European Patent Application No. 23205387.6 on May 16, 2024; 8 pages.
European Patent Office, Extended European Search Report and Opinion issued in European Patent Application No. 23205075.7 on Apr. 2, 2024; 12 pages.
European Patent Office, Extended European Search Report and Opinion issued in European Patent Application No. 23206305.7 on May 7, 2024; 11 pages.
U.S. Patent and Trademark Office, Notice of Allowance issued in U.S. Appl. No. 18/103,776, filed Sep. 30, 2025; 21 pages.
U.S. Patent and Trademark Office, Non-Final Office Action issued in U.S. Appl. No. 18/109,126, filed Sep. 24, 2025; 12 pages.
U.S. Patent and Trademark Office, Notice of Allowance issued in U.S. Appl. No. 18/109,126, filed Mar. 24, 2026; 30 pages.

* cited by examiner

FIELD-EFFECT TRANSISTORS FORMED USING A WIDE BANDGAP SEMICONDUCTOR MATERIAL

BACKGROUND

The disclosure relates to semiconductor devices and integrated circuit manufacture and, more specifically, to structures for a field-effect transistor and methods of forming such structures.

Wide bandgap semiconductors, such as silicon carbide, may be used in high-power applications and/or high-temperature applications. Silicon carbide is well suited for power switching because of its advantageous properties, such as a high saturated drift velocity, a high critical field strength, an exceptional thermal conductivity, and a significant mechanical strength. A metal-oxide-semiconductor field-effect transistor is a type of gate-voltage-controlled power switching device that uses field inversion as a current control mechanism. A metal-oxide-semiconductor field-effect transistor may leverage the favorable properties of a silicon carbide substrate to enable, for example, power converters, motor inverters, and motor drivers that are characterized by high reliability and high efficiency when operating at a high voltage.

Improved structures for a field-effect transistor and methods of forming such structures are needed.

SUMMARY

In an embodiment of the invention, a structure for a field-effect transistor is provided. The structure comprises a semiconductor substrate including a top surface, a doped region adjacent to the top surface, and a trench that extends through the doped region. The semiconductor substrate comprises a wide bandgap semiconductor material. The structure further comprises a gate structure including a gate conductor layer. The gate conductor layer has a first portion disposed above the top surface of the semiconductor substrate and a second portion disposed inside the trench below the top surface of the semiconductor substrate.

In an embodiment of the invention, a method of forming a structure for a field-effect transistor is provided. The method comprises forming a doped region in a semiconductor substrate adjacent to a top surface of the semiconductor substrate, forming a trench in the semiconductor substrate, and forming a gate structure including a gate conductor layer. The semiconductor substrate comprises a wide bandgap semiconductor material, the trench extends through the doped region, and the gate conductor layer has a first portion disposed above the top surface of the semiconductor substrate and a second portion disposed inside the trench below the top surface of the semiconductor substrate.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
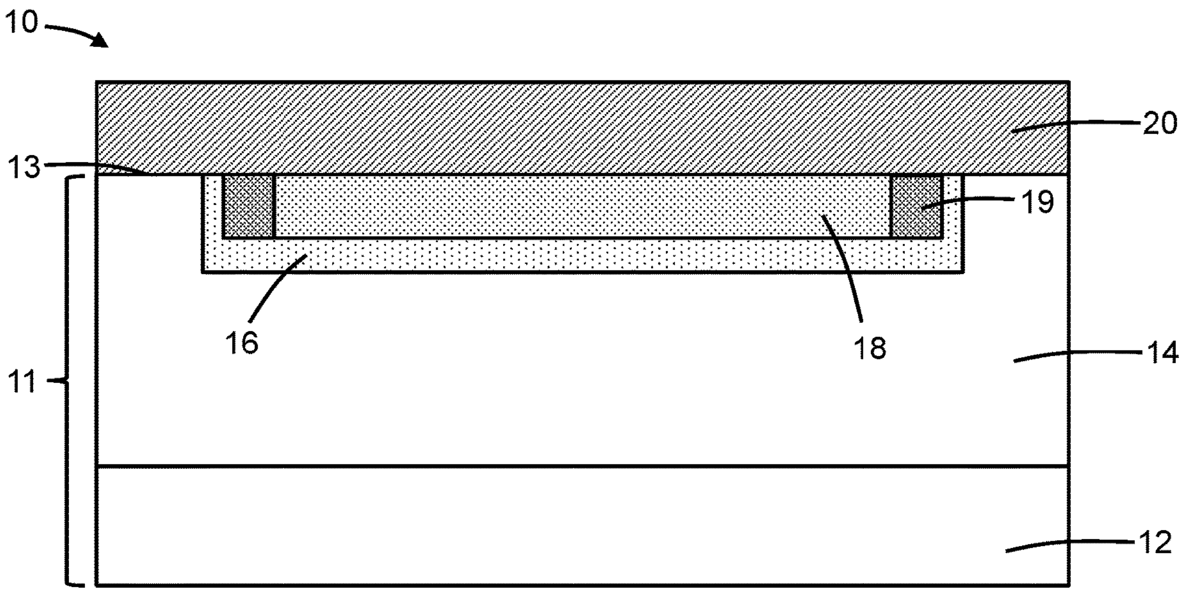
FIGS. 1-6 are cross-sectional views of a structure at successive fabrication stages of a processing method in accordance with embodiments of the invention.

With reference to FIG. 1 and in accordance with embodiments of the invention, a structure 10 for a field-effect transistor may be formed using a semiconductor substrate 11 that includes a bulk substrate 12 and a semiconductor layer 14 formed by, for example, epitaxial growth on the bulk substrate 12. In an embodiment, the semiconductor layer 14 of the semiconductor substrate 11 may be comprised of a wide bandgap semiconductor material, such as silicon carbide. In an embodiment, the bulk substrate 12 of the semiconductor substrate 11 may be comprised of a wide bandgap semiconductor material. In an embodiment, the semiconductor substrate 11 may be comprised of silicon carbide, which is a wide bandgap semiconductor material. In an embodiment, the semiconductor substrate 11 may be comprised of diamond, which is a wide bandgap semiconductor material. In an embodiment, the bulk substrate 12 and the semiconductor layer 14 may be comprised of a semiconductor material having a melting point greater than the melting point of silicon. In an embodiment, the bulk substrate 12 and the semiconductor layer 14 may be comprised of silicon carbide that is doped to have n-type electrical conductivity. In an embodiment, the bulk substrate 12 and the semiconductor layer 14 may be comprised of silicon carbide that is doped to have n-type electrical conductivity with the bulk substrate 12 having a higher dopant concentration and a lower electrical resistivity than the semiconductor layer 14. In an embodiment, the bulk substrate 12 may have a resistivity of less than 25 mOhm-cm. In an embodiment, the semiconductor layer 14 may include a buffer sublayer grown directly on the bulk substrate 12 and a drift sublayer grown on the buffer sublayer, and the drift sublayer may have a dopant concentration and a thickness that are optimized for device operation in a 650 volt to 1200 volt range. In an embodiment, the bulk substrate 12 may operate as the drain of the field-effect transistor.

A doped region 16 may be formed in the semiconductor layer 14 adjacent to a top surface 13 of the semiconductor substrate 11. The doped region 16 is doped to have an opposite conductivity type from the semiconductor layer 14. The doped region 16 has a lower boundary that defines an interface with the underlying semiconductor material of the semiconductor layer 14 across which the dopant type changes. In an embodiment, the doped region 16 may define a body of the field-effect transistor.

The doped region 16 may be formed by introducing a dopant of a given conductivity type by, for example, ion implantation into the semiconductor layer 14. An implantation mask may be formed to define a selected area on a top surface 13 of the semiconductor substrate 11 that is exposed for the implantation of ions. The implantation mask may include a hardmask that is applied and patterned to form an opening exposing the selected area on the top surface 13 and determining, at least in part, the location and horizontal dimensions of the doped region 16. The implantation conditions (e.g., ion species, dose, kinetic energy, substrate temperature) may be selected to tune the electrical and physical characteristics of the doped region 16, to minimize defects, and to maximize the ionization and activation of the implanted dopants. In an embodiment, the ion implantation may be performed at substrate temperature in a range of 200 °C to 600 °C to minimize defect formation. The implantation mask, which is compatible with the implantation conditions and is stripped following implantation, has a thickness and stopping power sufficient to block the implantation of ions in masked areas. In an embodiment, the doped region 16 may be doped with a concentration of a p-type dopant (e.g., aluminum) to provide p-type electrical conductivity.

Contacts 19 may be formed at the periphery of the doped region 16. The contacts 19 may be formed by ion implantation using an implantation mask, and the contacts 19 may have the same conductivity type (e.g., p-type) as the doped region 16 but at a higher dopant concentration. The contacts 19 may provide body contacts to the body of the field-effect transistor defined by the doped region 16.

A doped region 18 may be formed in the semiconductor layer 14 adjacent to a top surface 13 of the semiconductor substrate 11. The doped region 18 has the same conductivity type as the semiconductor layer 14 but at a higher dopant concentration. The doped region 18 has an upper boundary that may be coplanar or substantially coplanar with the top surface 13 of the semiconductor substrate 11 and a lower boundary that defines an interface with the doped region 16 across which the conductivity type changes. In an embodiment, the doped region 18 may define a source of the field-effect transistor.

The doped region 18 may be formed by introducing a dopant of a given conductivity type by, for example, ion implantation into the semiconductor layer 14. An implantation mask may be formed to define a selected area on a top surface 13 of the semiconductor substrate 11 that is exposed for the implantation of ions. The implantation mask may include a hardmask that is applied and patterned to form an opening exposing the selected area on the top surface 13 of the semiconductor substrate 11 and determining, at least in part, the location and horizontal dimensions of the doped region 18. The implantation conditions (e.g., ion species, dose, kinetic energy, substrate temperature) may be selected to tune the electrical and physical characteristics of the doped region 18. In an embodiment, the ion implantation may be performed at substrate temperature in a range of 200 °°C to 600 °°C to minimize defect formation. The implantation mask, which is compatible with the implantation conditions and is stripped following implantation, has a thickness and stopping power sufficient to block the implantation of ions in masked areas. In an embodiment, the doped region 18 may be doped with a concentration of an n-type dopant (e.g., nitrogen and/or phosphorus) to provide n-type electrical conductivity. In an embodiment, the doped region 18 may be doped with a higher concentration of the n-type dopant than the semiconductor layer 14.

A hardmask 20 is applied on the top surface 13 of the semiconductor substrate 11 and, in particular, the hardmask 20 may be disposed on the top surface 13 over the doped regions 16, 18. The hardmask 20 may be comprised of a material that is characterized by a high melting point. In an embodiment, the hardmask 20 may be comprised of a material that is characterized by a melting point greater than or equal to 2000 °C. In an embodiment, the hardmask 20 may be comprised of a material that is an electrical insulator and that is characterized by a melting point greater than or equal to 2000 °C. In an embodiment, the hardmask 20 may be comprised of a material that is an insulating ceramic having a melting point greater than or equal to 2000 °C. In an embodiment, the hardmask 20 may be comprised of a material that is a high-resistivity semiconductor material having a melting point greater than or equal to 2000 °C. In an embodiment, the hardmask 20 may be comprised of a material characterized by a coefficient of thermal expansion that is similar to the coefficient of thermal expansion of crystalline silicon carbide.

In embodiments, the hardmask 20 may include one or more layers each comprised of a material that is characterized by a melting point greater than or equal to 2000 °C. In an embodiment, the hardmask 20 may include a layer comprised of aluminum nitride. In an embodiment, the hardmask 20 may include a layer comprised of polycrystalline silicon carbide. In an embodiment, the hardmask 20 may include a layer comprised of either aluminum nitride or polycrystalline silicon carbide that is disposed on a layer comprised of aluminum oxide. In an embodiment, the hardmask 20 may include a layer comprised of polycrystalline silicon carbide that is disposed on a layer comprised of aluminum nitride.

Figure 2:
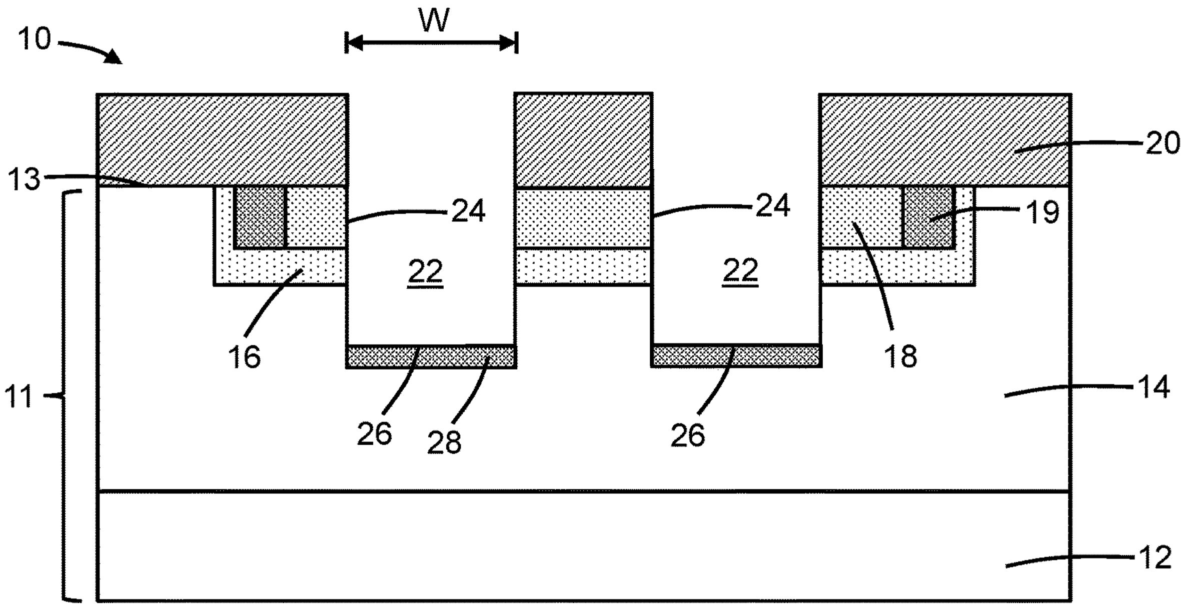

With reference to FIG. 2 in which like reference numerals refer to like features in FIG. 1 and at a subsequent fabrication stage, trenches 22 are formed by lithography and etching processes that extend through the hardmask 20 into the semiconductor substrate 11. More specifically, each trench 22 includes an upper portion that extends through the hardmask 20 and a lower portion that extends from the top surface 13 of the semiconductor substrate 11 through both of the doped regions 16, 18 and into the semiconductor layer 14 beneath the doped region 16. Each trench 22, which may have a width dimension W, has a sidewall 24 and a trench bottom 26 that is positioned between the top surface 13 and the interface between the bulk substrate 12 and the semiconductor layer 14. In contrast to conventional process flows, the hardmask 20 is not removed from the top surface 13 after the trenches 22 are formed.

A doped region 28 may be formed in the semiconductor layer 14 beneath the trench bottom 26 of each of the trenches 22. The doped regions 28 are positioned in a vertical direction between the trenches 22 and the bulk substrate 12 operating as the drain of the field-effect transistor. The doped regions 28 have an opposite conductivity type from the semiconductor layer 14 and the doped region 16. The doped regions 28 may participate in defining a p-shield of the field-effect transistor.

The doped regions 28 may be formed by introducing a dopant of a given conductivity type by, for example, ion implantation into the semiconductor layer 14. The trenches 22 in the hardmask 20 may determine, at least in part, the location and horizontal dimensions of the doped regions 28. The hardmask 20 has a thickness and stopping power sufficient to block the implantation of ions in masked areas. The implantation conditions (e.g., ion species, dose, kinetic energy, substrate temperature) may be selected to tune the electrical and physical characteristics of the doped regions 28. In an embodiment, the doped regions 28 may be doped with a concentration of a p-type dopant (e.g., aluminum) to provide p-type electrical conductivity.

A high-temperature anneal may be performed following the implantations to activate the implanted dopants and to alleviate post-implantation crystal damage. The high-temperature anneal may be performed with a removable carbon capping layer applied as a temporary coating on the hardmask 20 and at a high temperature, such as a temperature in a range of 1600 °C to 1900 °C. The hardmask 20, which can withstand the high anneal temperature, is disposed on the top surface 13 during the anneal and functions to enhance the surface protection during the anneal. The removable carbon capping layer may prevent silicon outgassing from surface areas, such as those surface areas inside the trenches 22, that are not covered and protected by the hardmask 20 during the high-temperature anneal. The carbon capping layer, which may be comprised of burned photoresist or a deposited layer of carbon, is removed following the high-temperature anneal. In a conventional process flow, all hardmasks are removed before the high-temperature anneal.

Figure 3:
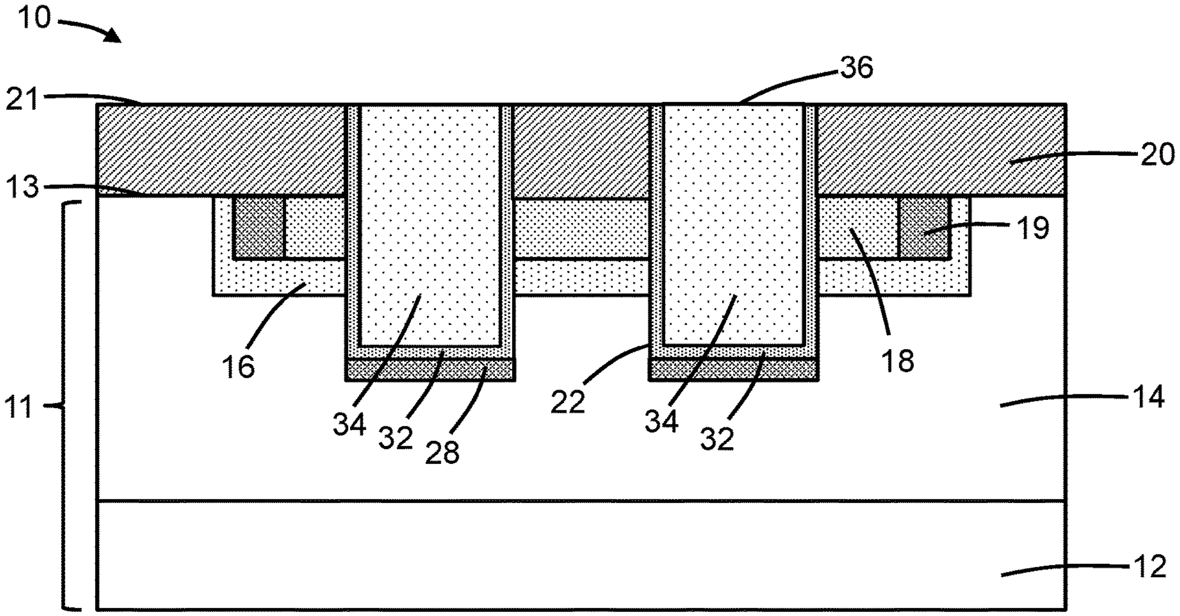

With reference to FIG. 3 in which like reference numerals refer to like features in FIG. 2 and at a subsequent fabrication stage, a gate structure including a gate dielectric layer 32 and a gate conductor layer 34 is formed inside each of the trenches 22. In an embodiment, the gate conductor layers 34 may be comprised of polysilicon that is heavily doped with an n-type dopant, such as phosphorus or arsenic, and the gate dielectric layers 32 may be comprised of a dielectric material, such as silicon dioxide, that is an electrical insulator. The gate dielectric layers 32 and gate conductor layers 34 may be deposited and then etched back using either reactive ion etching or chemical mechanical polishing such that each gate conductor layer 34 has a top surface 36 that is coplanar or substantially coplanar with a top surface 21 of the hardmask 20. Each gate conductor layer 34 extends through the hardmask 20 and the doped regions 16, 18 in the semiconductor substrate 11. The hardmask 20, which is present on the top surface 13, assists with self-alignment during the formation of the gate structures in the trenches 22. The gate dielectric layer 32 and gate conductor layer 34 of each gate structure project in a vertical direction above the top surface 13 due to the existence of the upper portions of the trenches 22 in the hardmask 20.

Figure 4:
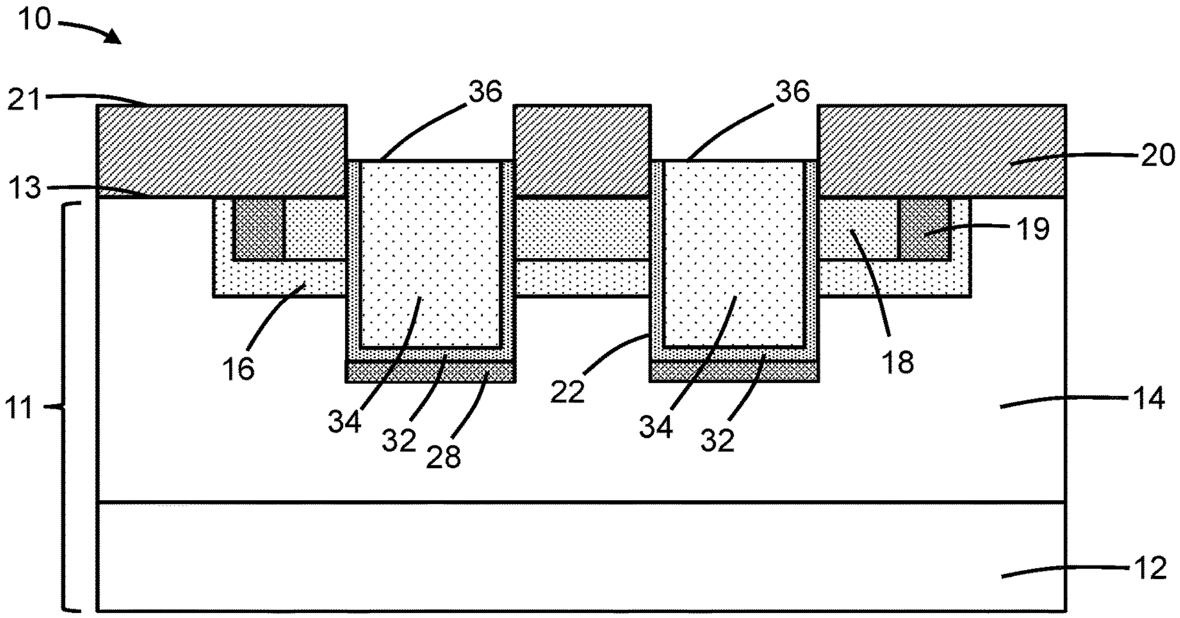

With reference to FIG. 4 in which like reference numerals refer to like features in FIG. 3 and at a subsequent fabrication stage, the gate dielectric layer 32 and the gate conductor layer 34 may be recessed by an etching process such that the top surface 36 of each gate conductor layer 34 is disposed within the trenches 22 below the top surface 21 of the hardmask 20. In an embodiment, the top surface 36 of each gate conductor layer 34 may be disposed in a vertical direction between the top surface 21 of the hardmask 20 and the top surface 13 of the semiconductor substrate 11. Each gate conductor layer 34 has an upper portion disposed above the top surface 13 of the semiconductor substrate 11 and a lower portion disposed in one of the trenches 22 below the top surface 13 of the semiconductor substrate 11. The upper and lower portions of each gate conductor layer 34 are disposed on opposite sides of the top surface 13 of the semiconductor substrate 11.

Figure 5:
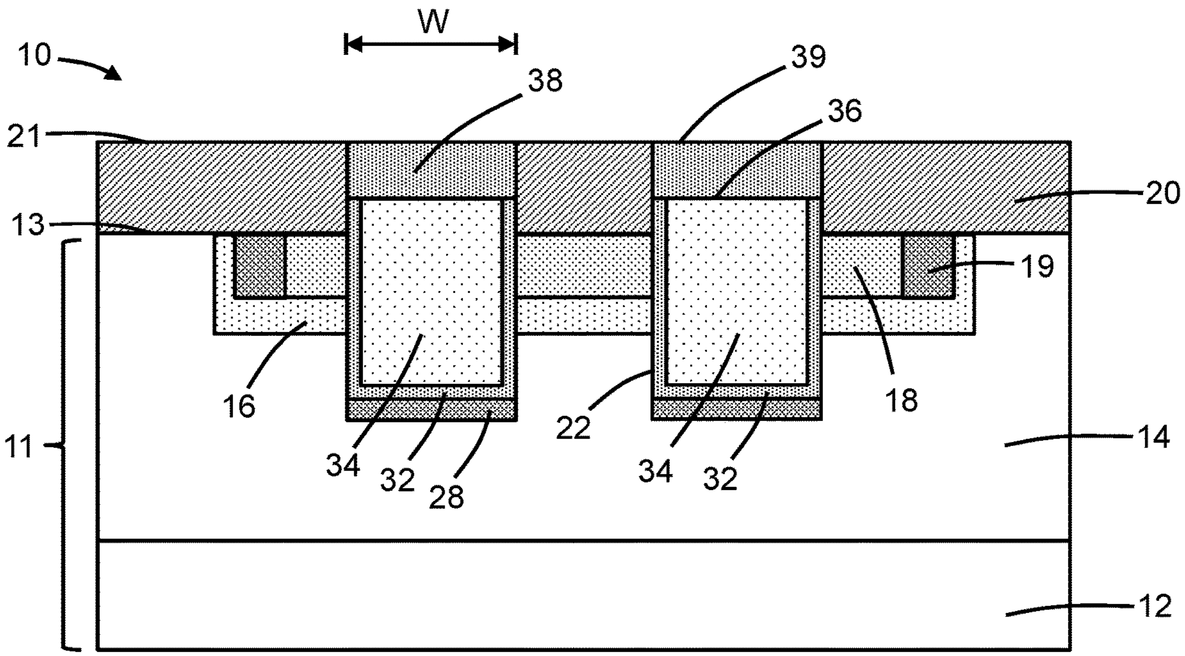

With reference to FIG. 5 in which like reference numerals refer to like features in FIG. 4 and at a subsequent fabrication stage, dielectric layers 38 are formed in the open spaces inside the trenches 22 over the recessed gate conductor layers 34. The dielectric layers 38 may be comprised of a dielectric material, such as silicon dioxide, that is an electrical insulator. In an embodiment, the dielectric layers 38 may be formed by depositing a dielectric material and polishing the dielectric material by chemical mechanical polishing to be coplanar or substantially coplanar with the top surface 21 of the hardmask 20. In an alternative embodiment, the formation of the dielectric layers 38 may include oxidizing the material of the gate conductor layers 34 by an oxidation process and polishing the oxidized material. The oxidation temperature may be selected in order to maximize the oxidation of the material constituting the gate conductor layers 34 and to minimize the oxidation of surrounding materials, such as the material of the hardmask 20.

The dielectric layers 38 may have a top surface 39 that is coplanar or substantially coplanar with the top surface 21 of the hardmask 20. Due to the spatial constraint imposed by the upper portions of the trenches 22 in the hardmask 20, the dielectric layers 38 may have a width dimension that is equal or substantially equal to the width dimension W of the trenches 22. The formation of the dielectric layers 38 inside the upper portions of the trenches 22 may enable an increase in the thickness of the dielectric layers 38.

Figure 6:
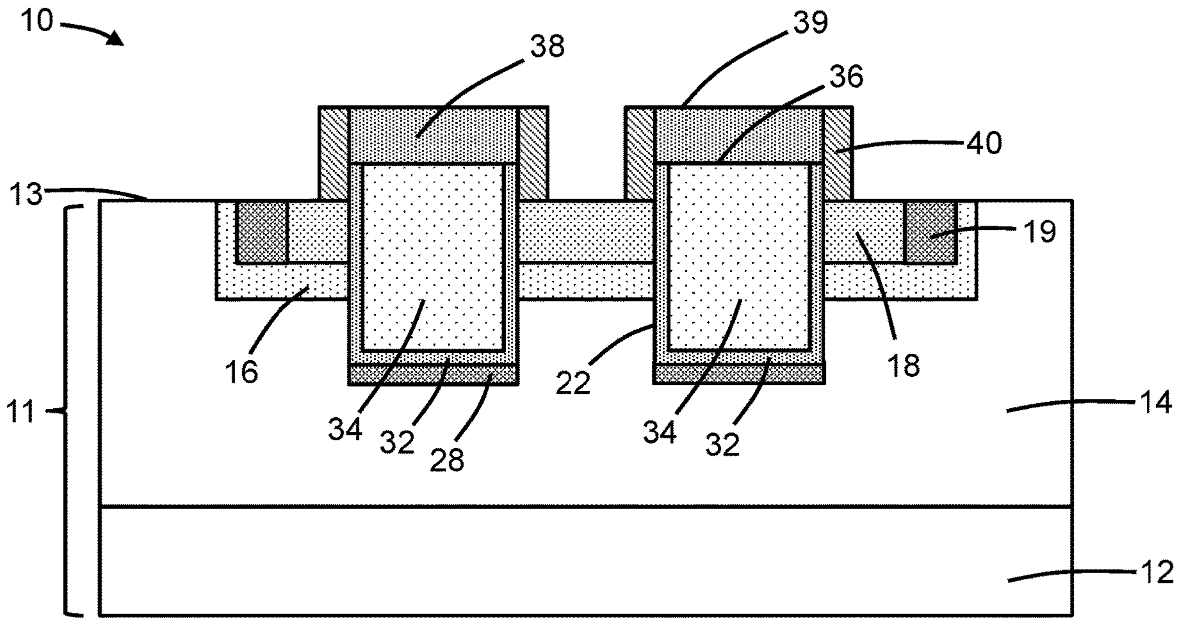

With reference to FIG. 6 in which like reference numerals refer to like features in FIG. 5 and at a subsequent fabrication stage, the hardmask 20 may be removed from the top surface 13 by an etching process. The removal of the hardmask 20 reveals the top surface 13 of the semiconductor substrate 11 and provides access for contacting the doped regions 16, 18. The hardmask 20 may be removed without disturbing the dielectric layers 38, which are also revealed when the hardmask 20 is removed.

Dielectric spacers 40 may be formed on the sidewalls of the dielectric layers 38. In an embodiment, the dielectric spacers 40 may be comprised of a dielectric material, such as silicon nitride, silicon oxynitride, or silicon dioxide, that is an electrical insulator and that is conformally deposited and then anisotropically etched. In an alternative embodiment, the dielectric spacers 40 may be omitted from the structure 10.

Middle-of-line processing and back-end-of-line processing may follow, which includes formation of silicide, contacts, vias, and wiring for an interconnect structure that is coupled to the structure 10. In an embodiment, the completed structure 10 may be used to form a metal-oxide-semiconductor field-effect transistor.

Figure 7:
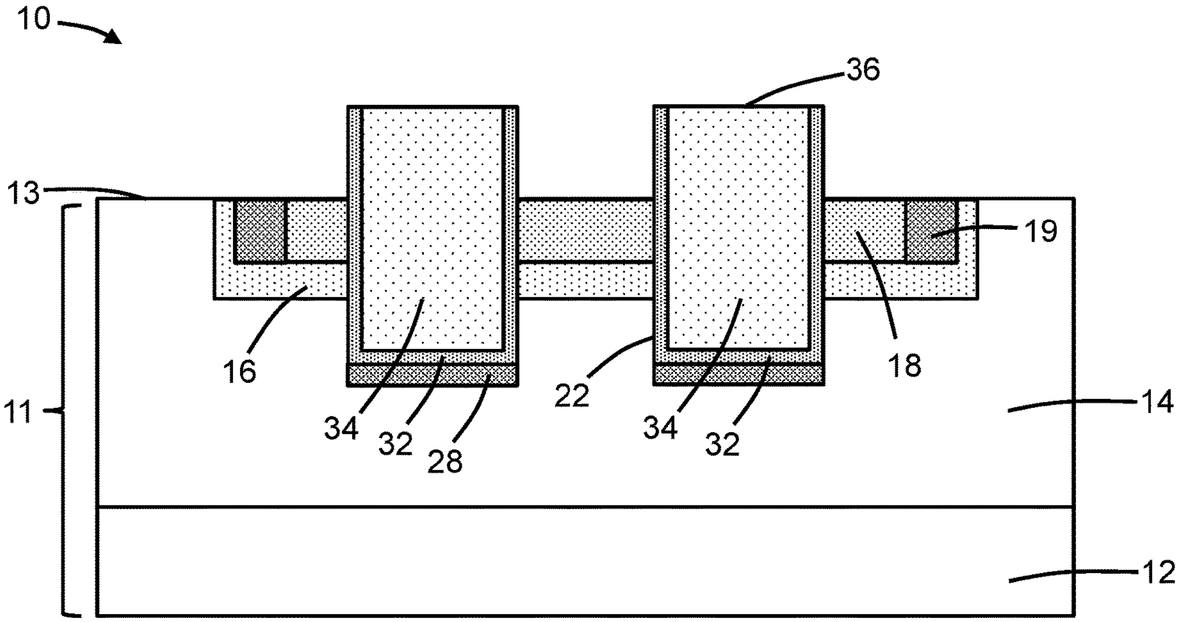
FIGS. 7-8 are cross-sectional views of a structure at successive fabrication stages of a processing method in accordance with alternative embodiments of the invention.

With reference to FIG. 7 and in accordance with alternative embodiments, the hardmask 20 may be removed after the gate conductor layers 34 are formed and without recessing the gate conductor layers 34 before the removal of the hardmask 20. The upper portion of each gate conductor layer 34 is disposed above the top surface 13 of the semiconductor substrate 11 and is no longer surrounded by the hardmask 20.

Figure 8:
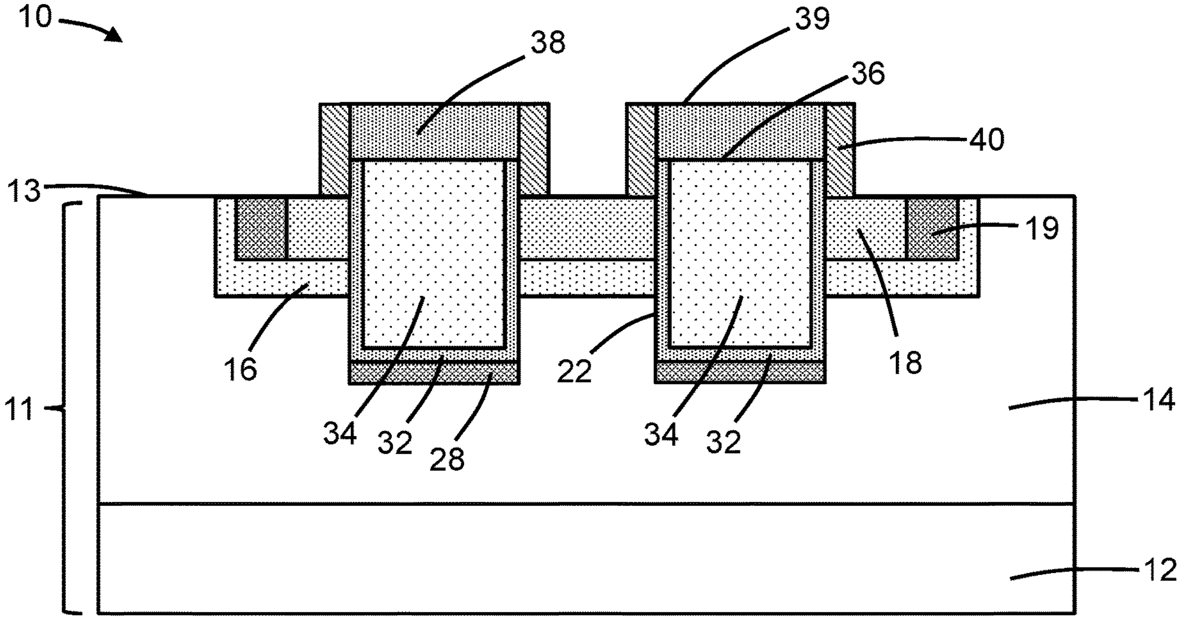

With reference to FIG. 8 in which like reference numerals refer to like features in FIG. 7 and at a subsequent fabrication stage, the dielectric layers 38 may be formed on the upper portions of the gate conductor layers 34 after removing the hardmask 20. In an embodiment, the dielectric layers 38 may be formed by an oxidation process, which effectively shortens the height of each gate conductor layer 34.

Figure 9:
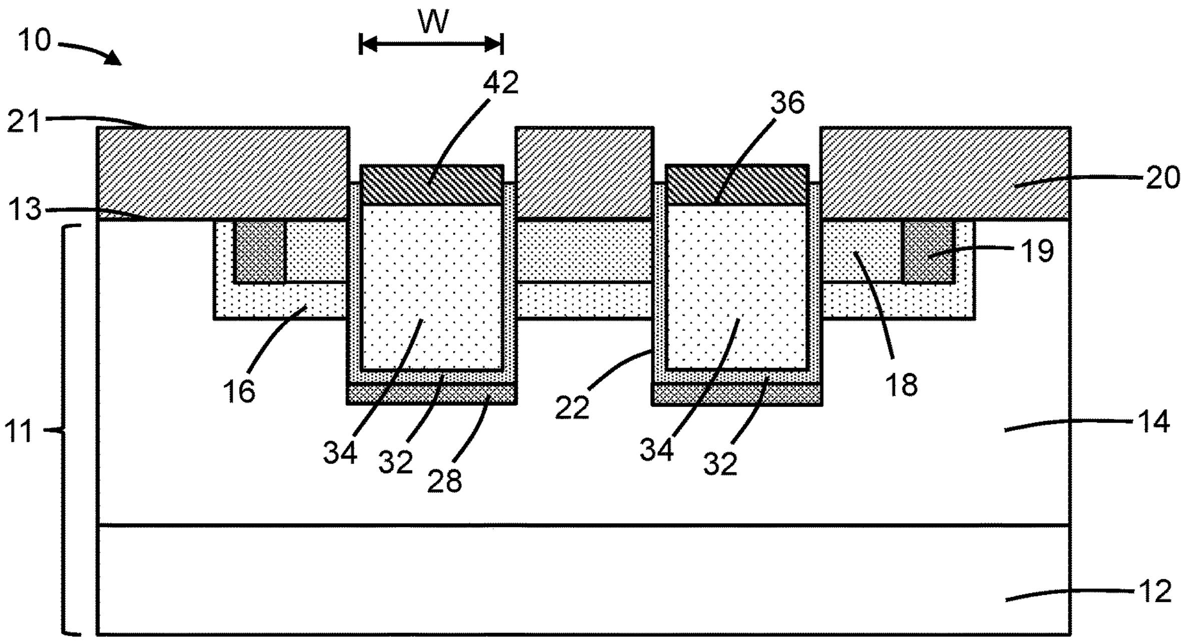
FIGS. 9-11 are cross-sectional views of a structure at successive fabrication stages of a processing method in accordance with alternative embodiments of the invention.

With reference to FIG. 9 and in accordance with alternative embodiments, a silicide layer 42 may be formed by a silicidation process on each gate conductor layer 34. The trenches 22 in the hardmask 20 enable the silicide layers 42 to be formed with self-alignment to the gate conductor layers 34. Due to the spatial constraint imposed by the trenches 22, the silicide layers 42 may have a width dimension that is equal or approximately equal to the width dimension W of the trenches 22. In an embodiment, the silicide layers 42 may be disposed below the top surface 21 of the hardmask 20.

In an embodiment, the silicide layers 42 may be formed by depositing a silicide-forming metal, performing one or more annealing steps to form a silicide phase by reacting the silicide-forming metal with the semiconductor material of the gate conductor layers 34, and selectively removing any unreacted silicide-forming metal. The silicide layers 42 may then be subjected to an additional annealing step at a higher temperature to form a lower-resistance silicide phase. In an embodiment, the silicide-forming metal employed to form the silicide layers 42 may be comprised of nickel.

Figure 10:
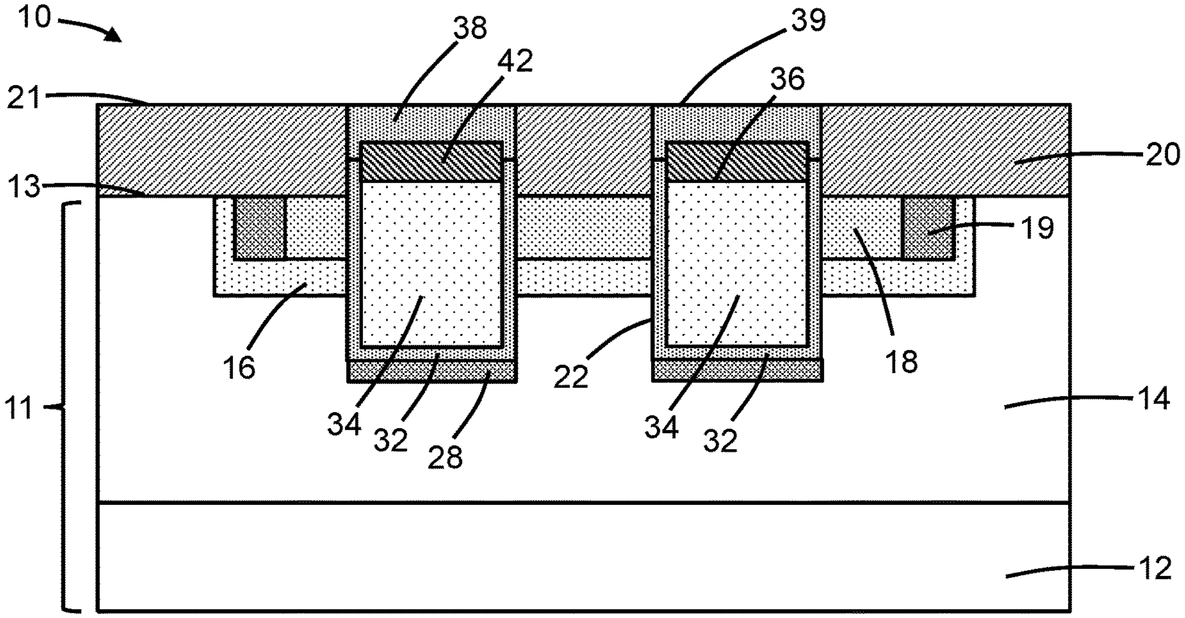

With reference to FIG. 10 in which like reference numerals refer to like features in FIG. 9 and at a subsequent fabrication stage, the dielectric layers 38 may be formed on the upper portions of the gate conductor layers 34 after forming the silicide layers 42. In an embodiment, the dielectric layers 38 may be deposited and planarized to fill the spaces inside the trenches 22 over the silicide layers 42.

Figure 11:
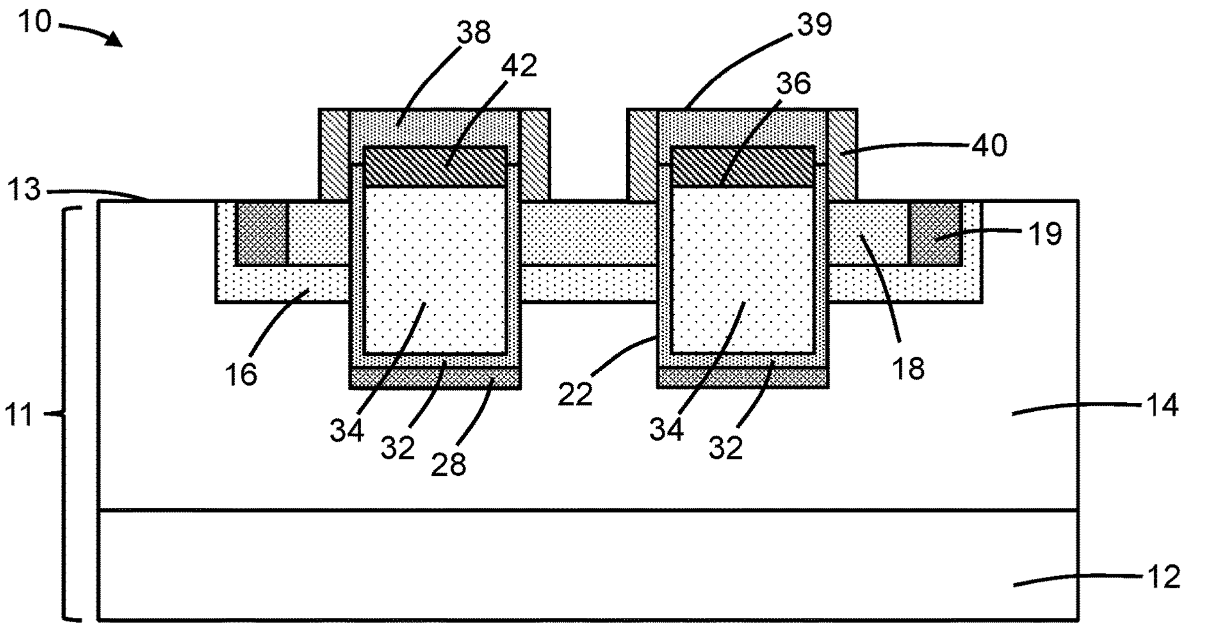

With reference to FIG. 11 in which like reference numerals refer to like features in FIG. 10 and at a subsequent fabrication stage, the hardmask 20 may be removed by an etching process after forming the dielectric layers 38, followed by the optional formation of the dielectric spacers 40. The hardmask 20 may be removed without disturbing the dielectric layers 38.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a structure for a field-effect transistor, the method comprising:

forming a doped region in a semiconductor substrate adjacent to a top surface of the semiconductor substrate, wherein the semiconductor substrate comprises a wide bandgap semiconductor material;

forming a hardmask on the top surface of the semiconductor substrate, wherein the hardmask comprises a material having a melting point that is greater than or equal to 2000 °C;

forming a trench in the semiconductor substrate, wherein the trench extends through the hardmask and the doped region into the semiconductor substrate beneath the doped region;

activating a dopant of the doped region at a temperature of 1600 °C to 1900 °C with the hardmask on the top surface of the semiconductor substrate and after forming the trench;

forming a gate structure including a gate conductor layer, wherein the gate conductor layer has a first portion disposed above the top surface of the semiconductor substrate and a second portion disposed inside the trench below the top surface of the semiconductor substrate, and the gate conductor layer comprises silicon;

forming a dielectric layer inside a portion of the trench over the gate conductor layer by oxidizing the silicon of the gate conductor layer; and removing the hardmask to reveal the top surface of the semiconductor substrate over the doped region after forming the trench, activating the dopant of the doped region, forming the gate structure, and forming the dielectric layer.

2. The method of claim 1 wherein the material comprises aluminum nitride.

3. The method of claim 1 wherein the material comprises polycrystalline silicon carbide.

4. The method of claim 1 wherein the material comprises aluminum oxide and either aluminum nitride or polycrystalline silicon carbide.

5. The method of claim 1 wherein the hardmask includes a first layer and a second layer that is disposed on the first layer, the first layer comprises aluminum nitride, and the second layer comprises polycrystalline silicon carbide.

6. The method of claim 1 wherein forming the doped region in the semiconductor substrate adjacent to the top surface of the semiconductor substrate comprises:

introducing the dopant by ion implantation into the semiconductor substrate to form the doped region.

7. The method of claim 6 wherein activating the dopant of the doped region at the temperature of 1600 °C to 1900 °C with the hardmask on the top surface of the semiconductor substrate comprises:

performing a high-temperature anneal at the temperature of 1600 °C to 1900 °C.

8. The method of claim 1 wherein activating the dopant of the doped region at the temperature of 1600 °C to 1900 °C with the hardmask on the top surface of the semiconductor substrate comprises:

performing a high-temperature anneal at the temperature of 1600 °C to 1900 °C.

9. The method of claim 8 further comprising:
applying a carbon capping layer before performing the high-temperature anneal.

10. The method of claim 9 further comprising:
removing the carbon capping layer after performing the high-temperature anneal.

11. The method of claim 1 wherein the dielectric layer and the trench have equal width dimensions.

12. The method of claim 11 further comprising:
planarizing the dielectric layer to have a top surface that is coplanar with a top surface of the hardmask.

13. The method of claim 1 further comprising:
planarizing the dielectric layer to have a top surface that is coplanar with a top surface of the hardmask.

14. The method of claim 1 wherein the dielectric layer and the trench have substantially equal width dimensions.

15. The method of claim 14 further comprising:
planarizing the dielectric layer to have a top surface that is coplanar with a top surface of the hardmask.

16. The method of claim 15 further comprising:
forming a dielectric spacer on a sidewall of the dielectric layer after removing the hardmask.

17. The method of claim 1 further comprising:
forming a dielectric spacer on a sidewall of the dielectric layer after removing the hardmask.

* * * * *